(12) United States Patent
Okamoto

(10) Patent No.: US 7,378,871 B2
(45) Date of Patent: May 27, 2008

(54) PROGRAMMABLE DEVICE WITH STRUCTURE FOR STORING CONFIGURATION INFORMATION

(75) Inventor: Minoru Okamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 90 days.

(21) Appl. No.: 11/264,138

(22) Filed: Nov. 2, 2005

(65) Prior Publication Data

US 2006/0119387 A1 Jun. 8, 2006

(30) Foreign Application Priority Data

Nov. 30, 2004 (JP) ............................. 2004-345482

(51) Int. Cl.
   *H03K 19/173* (2006.01)
   *H03K 19/177* (2006.01)
   *H03K 19/00* (2006.01)

(52) U.S. Cl. ..................... 326/41; 326/37; 326/38; 326/39; 326/47; 326/101

(58) Field of Classification Search ............... 326/38, 326/39, 40, 41, 47, 37
See application file for complete search history.

(56) References Cited

U.S. PATENT DOCUMENTS

| 6,281,703 B1 * | 8/2001 | Furuta et al. ............. 326/40 |
| 6,404,224 B1 * | 6/2002 | Azegami et al. ........... 326/38 |
| 6,774,668 B1 * | 8/2004 | Wirtz, II ................... 326/37 |
| 2004/0178818 A1 * | 9/2004 | Crotty et al. ............. 326/40 |
| 2005/0248364 A1 * | 11/2005 | Vadi et al. ............... 326/39 |

\* cited by examiner

*Primary Examiner*—Rexford Barnie
*Assistant Examiner*—Thienvu V Tran
(74) *Attorney, Agent, or Firm*—McDermott Will & Emery LLP

(57) ABSTRACT

In a programmable cell included in a first region, configuration information is stored in a volatile memory, while in a programmable cell included in a second region, configuration information is stored in a non-volatile memory. Configuration information for a sub-process common to a plurality of processes is stored in the non-volatile memory.

19 Claims, 10 Drawing Sheets

PROGRAMMABLE DEVICE WITH STRUCTURE FOR STORING CONFIGURATION INFORMATION

BACKGROUND OF THE INVENTION

The present invention relates to programmable devices, and more particularly relates to a structure for storing information for controlling operation of a device including a plurality of programmable cells.

A programmable device, typified by FPGA (Field Programmable Gate Array), includes a number of programmable cells which perform various operations, with each programmable cell carrying out a specific operation corresponding to the processing to be realized by the programmable device. Such a programmable device, in which a large number of programmable cells are simultaneously operated to execute enormous operations typified by multimedia processing, has been attracting much attention recently. Configuration information indicates what operation is to be executed by each programmable cell, and this configuration information is stored in an internal memory in each programmable cell.

In a known programmable device technique, all of the programmable cells have the same structure and include internal memories of the same structure (see U.S. Pat. No. 6,281,703).

In this known structure, however, every time the programmable device is powered on, configuration information must be stored in all of the programmable cells included in the programmable device. The known technique thus has a problem in that the amount of time required for the configuration (which will be hereinafter referred to as a "configuration time") is increased.

Also, the above-described programmable device, in which all of the programmable cells have the same structure and include internal memories of the same structure, has another problem in that the internal memories occupy a large circuit area in the device.

SUMMARY OF THE INVENTION

In view of the above, it is therefore an object of the present invention to provide a programmable device having a structure, in which the configuration time is shortened and in addition the circuit size is reduced to thereby reduce power consumption.

In order to achieve the object, a first inventive programmable device including a plurality of programmable cells, each of which includes an internal memory for storing configuration information input from outside, and an arithmetic circuit for performing operation based on the configuration information stored in the internal memory, includes: at least one first type of programmable cell including a non-volatile memory as the internal memory; and a control circuit for outputting, to the first-type programmable cell, the configuration information and a control signal indicating writing of the configuration information. When the programmable device further includes at least one second type of programmable cell including a volatile memory as the internal memory, the control circuit further has the function of outputting, to the second-type programmable cell, the configuration information and a control signal indicating writing of the configuration information.

A second inventive programmable device including a plurality of programmable cells, each of which includes an internal memory for storing configuration information input from outside, and an arithmetic circuit for performing operation based on the configuration information stored in the internal memory, includes: at least one first type of programmable cell including a non-volatile memory as the internal memory; at least one second type of programmable cell including a volatile memory as the internal memory; and a control circuit for outputting, to the second-type programmable cell, the configuration information and a first control signal indicating writing of the configuration information. The control circuit further has the function of outputting, to the first-type programmable cell, a second control signal indicating, in order that the configuration information received from the second-type programmable cell by the first-type programmable cell be written into the first-type programmable cell, writing of the configuration information received from the second-type programmable cell.

According to the present invention, by separately storing configuration information in the volatile memory and the non-volatile memory, the amount of configuration time after power-off is shortened and in addition the circuit size is reduced to thereby achieve reduction in power consumption.

DETAILED DESCRIPTION OF THE INVENTION

Hereinafter, programmable devices according to first through third embodiments of the present invention will be described in detail with reference to the accompanying drawings.

First Embodiment

Figure 1:
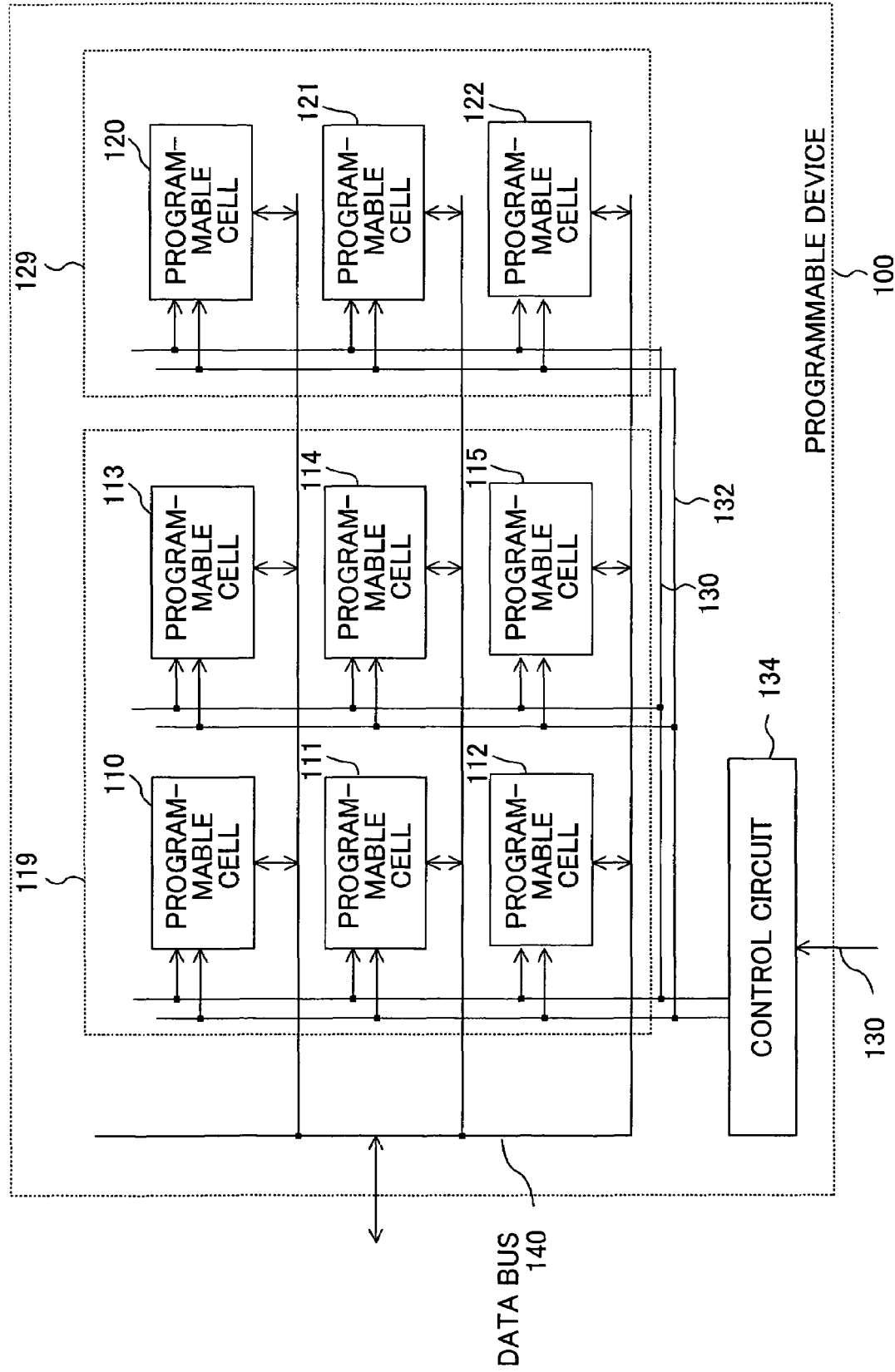
FIG. 1 is a block diagram illustrating the structure of a programmable device according to a first embodiment of the present invention.
Figure 2:
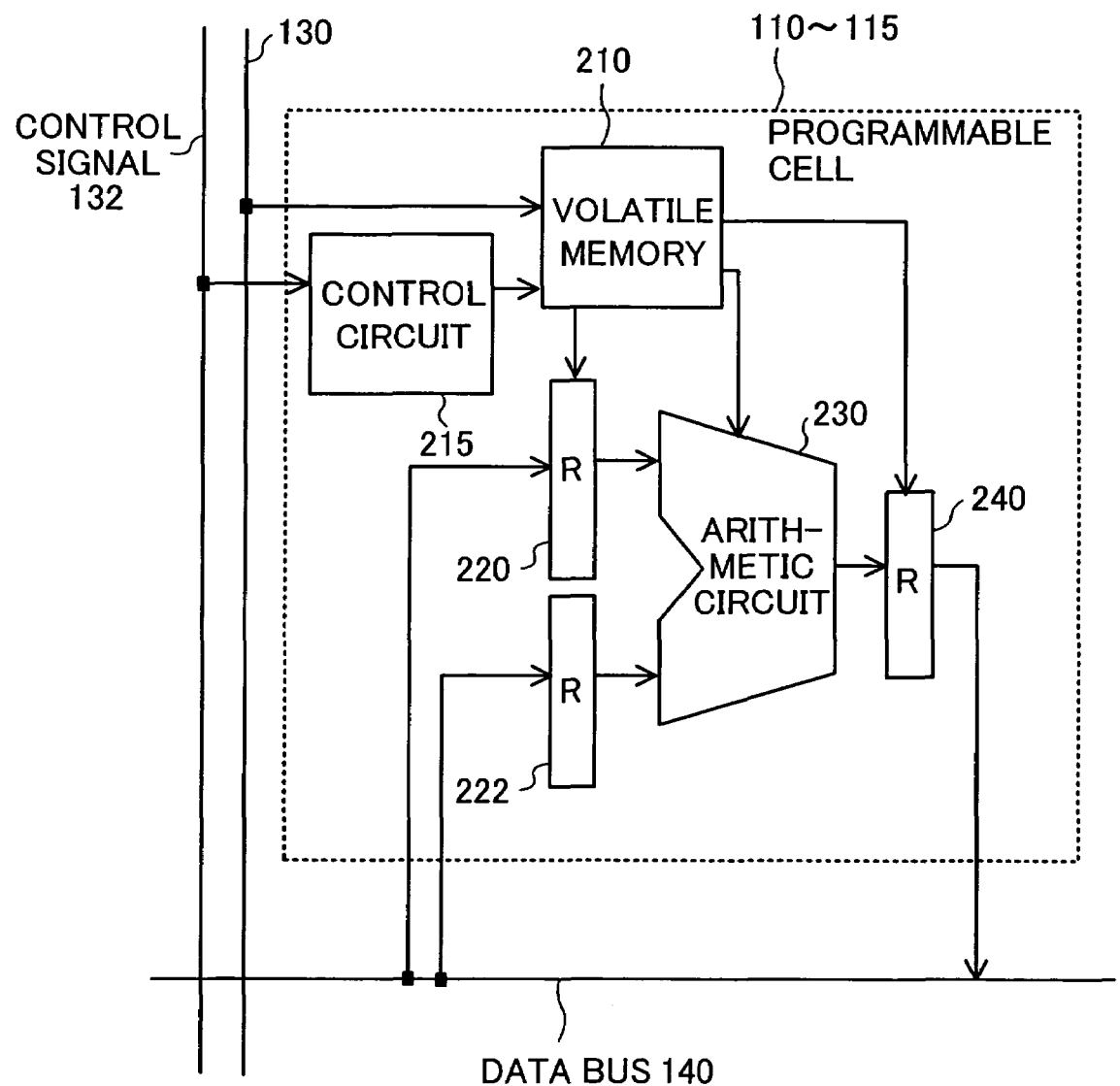
FIG. 2 is a block diagram illustrating the internal structures of first to sixth programmable cells shown in FIG. 1.
Figure 3:
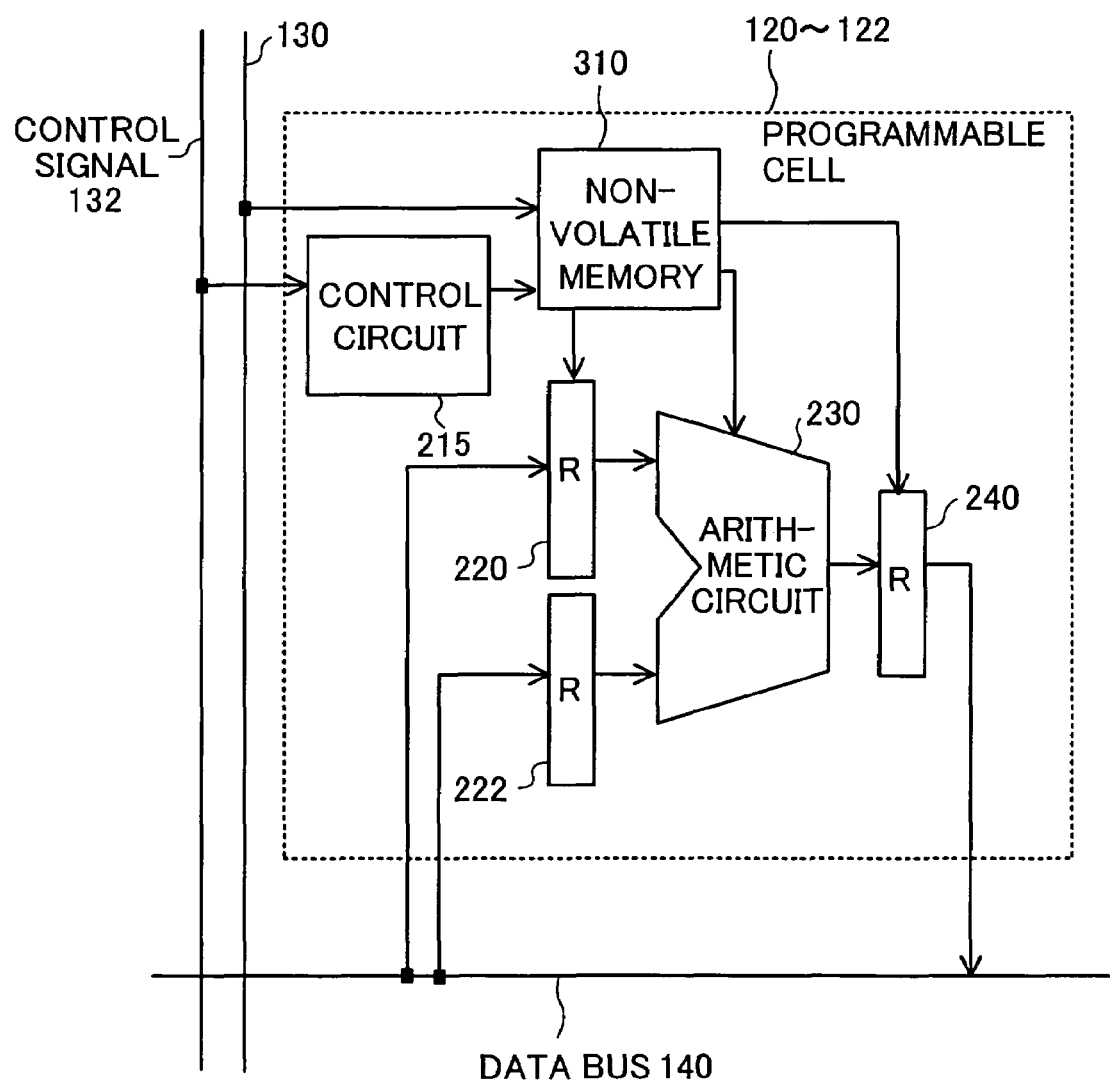
FIG. 3 is a block diagram illustrating the internal structures of seventh to ninth programmable cells shown in FIG. 1.

FIG. 1 illustrates the structure of a programmable device 100 according to a first embodiment. FIGS. 2 and 3 illustrate the internal structures of a plurality of programmable cells included in the programmable device 100.

The programmable device 100 shown in FIG. 1 includes a first region 119, a second region 129, a control circuit 134, and a data bus 140. The first region 119 includes first to sixth programmable cells 110 to 115 shown in FIG. 2. The second region 129 includes seventh to ninth programmable cells 120 to 122 shown in FIG. 3. The control circuit 134 receives configuration information 130 supplied from a block (not shown) and outputs the configuration information 130 and a control signal 132 indicating in which programmable cell the configuration information 130 is to be stored. The data bus 140 provides the first to ninth programmable cells 110 to 115 and 120 to 122 with data on which operations are to be performed.

The first to sixth programmable cells 110 to 115 shown in FIG. 2 each include a volatile memory 210 which stores therein the configuration information 130 in accordance with an instruction given by the control signal 132. More specifically, the control signal 132 contains information that indicates in which one of the first to ninth programmable cells 110 to 115 and 120 to 122 the configuration information 130 is to be written, and this information is input into an internal control circuit 215. The internal control circuit 215 decodes this information, and when it is found that the configuration information 130 is for its own, the internal control circuit 215 outputs a write signal to the volatile memory 210. Upon receipt of the write signal, the volatile memory 210 retains the contents of the configuration information 130. The volatile memory 210 gives instructions as to operation of two registers 220 and 222 for storing data input from the data bus 140, operation of an arithmetic circuit 230 for performing arithmetic operation on data output from the registers 220 and 222, and operation of a register 240 for retaining the result of arithmetic operation output from the arithmetic circuit 230 and outputting the retained content to the data bus 140. SRAM (Static Random Access Memory) and DRAM (Dynamic Random Access Memory), for example, are suitable for the volatile memory 210.

The seventh to ninth programmable cells 120 to 122 shown in FIG. 3 differ from the structure shown in FIG. 2 in that a non-volatile memory 310 is provided instead of the volatile memory 210. FeRAM (Ferro Electric RAM), for example, is suitable for the structure of the non-volatile memory 310. In recent years, FeRAM including one-transistor, one-capacitor (1T1C) cells has been developed. In FeRAM, the number of transistors included is smaller than that of SRAM, and stored contents are not lost even after the power is removed.

Figure 4A:
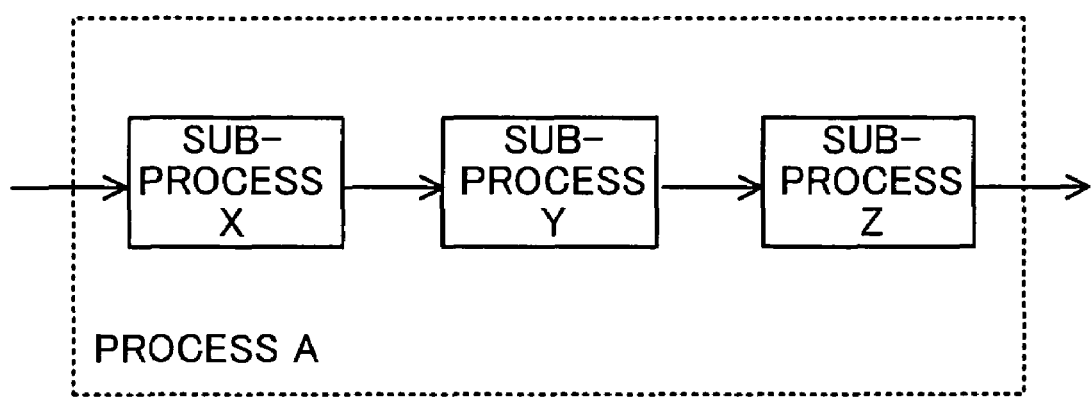
FIGS. 4A and 4B are conceptual diagrams illustrating the respective contents of processes A and B performed by the programmable device shown in FIG. 1.
Figure 4B:
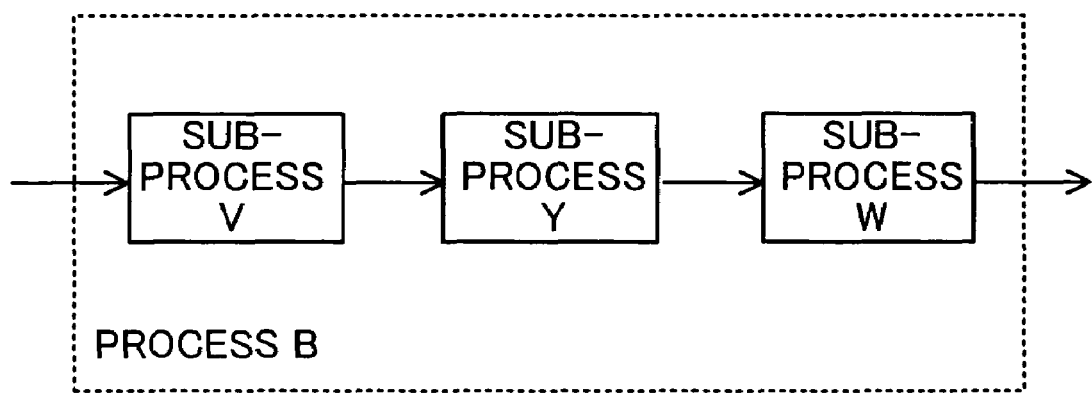

The programmable device 100 thus constructed performs processes shown in FIGS. 4A and 4B. The process A shown in FIG. 4A includes a sub-process X, a sub-process Y, and a sub-process Z, while the process B shown in FIG. 4B includes a sub-process V, the sub-process Y, and a sub-process W. The processes A and B thus include the common sub-process Y.

The programmable device 100 performs the process A or the process B in the following manner. First, the power for operating the programmable device 100 is turned on (the structure relating to the power-on procedure is not shown). Then, in the case of performing the process A, configuration information 130 supplied from a not-shown block is input into the control circuit 134. The control circuit 134 outputs the configuration information 130 and a control signal 132 indicating in which programmable cell this configuration information 130 is to be stored, to the first to ninth programmable cells 110 to 115 and 120 to 122 (a detailed circuit that generates the control signal 132 is not shown). In this process, part of the configuration information 130 that constitutes the sub-process X is written into the first to third programmable cells 110 to 112, part of the configuration information 130 that constitutes the sub-process Y is written into the seventh to ninth programmable cells 120 to 122, and part of the configuration information 130 that constitutes the sub-process Z is written into the fourth to sixth programmable cells 113 to 115.

Subsequently, data is input from outside via the data bus 140. The input data is subjected to the sub-process X executed by the first to third programmable cells 110 to 112, and the execution result is input into the seventh to ninth programmable cells 120 to 122 via the data bus 140. Next, the seventh to ninth programmable cells 120 to 122 execute the sub-process Y and input the execution result into the fourth to sixth programmable cells 113 to 115 via the data bus 140. The fourth to sixth programmable cells 113 to 115 then execute the sub-process Z and output the execution result to outside via the data bus 140. After the process A is performed in this manner, the power to the programmable device 100 is turned off. At this time, since the seventh to ninth programmable cells 120 to 122 have stored the configuration information in their non-volatile memories 310, the stored contents are not lost.

Next, in order for the programmable device 100 to perform the process B, the power for operating the programmable device 100 is turned on (the structure relating to the power-on procedure is not shown). Configuration information 130 supplied from a not-shown block is input into the control circuit 134 in the same manner as described above. The control circuit 134 outputs, to the first to sixth programmable cells 110 to 115, the configuration information 130 and a control signal 132 that indicates in which programmable cell this configuration information is 130 is to be stored (the structure for outputting the control signal 132 is not shown). In this process, part of the configuration information 130 that constitutes the sub-process V is written into the first to third programmable cells 110 to 112, while part of the configuration information 130 that constitutes the sub-process W is written into the fourth to sixth programmable cells 113 to 115.

As described above, when the process B is performed by the second configuration, part of the configuration information for realizing the sub-process Y remains retained in the seventh to ninth programmable cells 120 to 122, thereby eliminating the need for performing operation for newly storing that part of the configuration information 130. This allows the amount of time required for the configuration to be shortened. In addition, as described in this embodiment, every time the process is complete, the power can be frequency turned off to reduce the amount of electric power consumed by the programmable device 100. Furthermore, the number of transistors in the non-volatile memories 310 included in the seventh to ninth programmable cells 120 to 122 is smaller than that in the volatile memories 210 included in the first to sixth programmable cells 110 to 115. The programmable device 100 thus can be reduced in circuit size.

In the case described in this embodiment, configuration for realizing a process common to two types of processes, such as the sub-process Y, is performed in the seventh to ninth programmable cells 120 to 122. However, in cases in which a process, such as an OS (operating system), that is always involved in execution of various applications is assigned to the seventh to ninth programmable cells 120 to 122, similar effects are exhibited.

Second Embodiment

Figure 5:
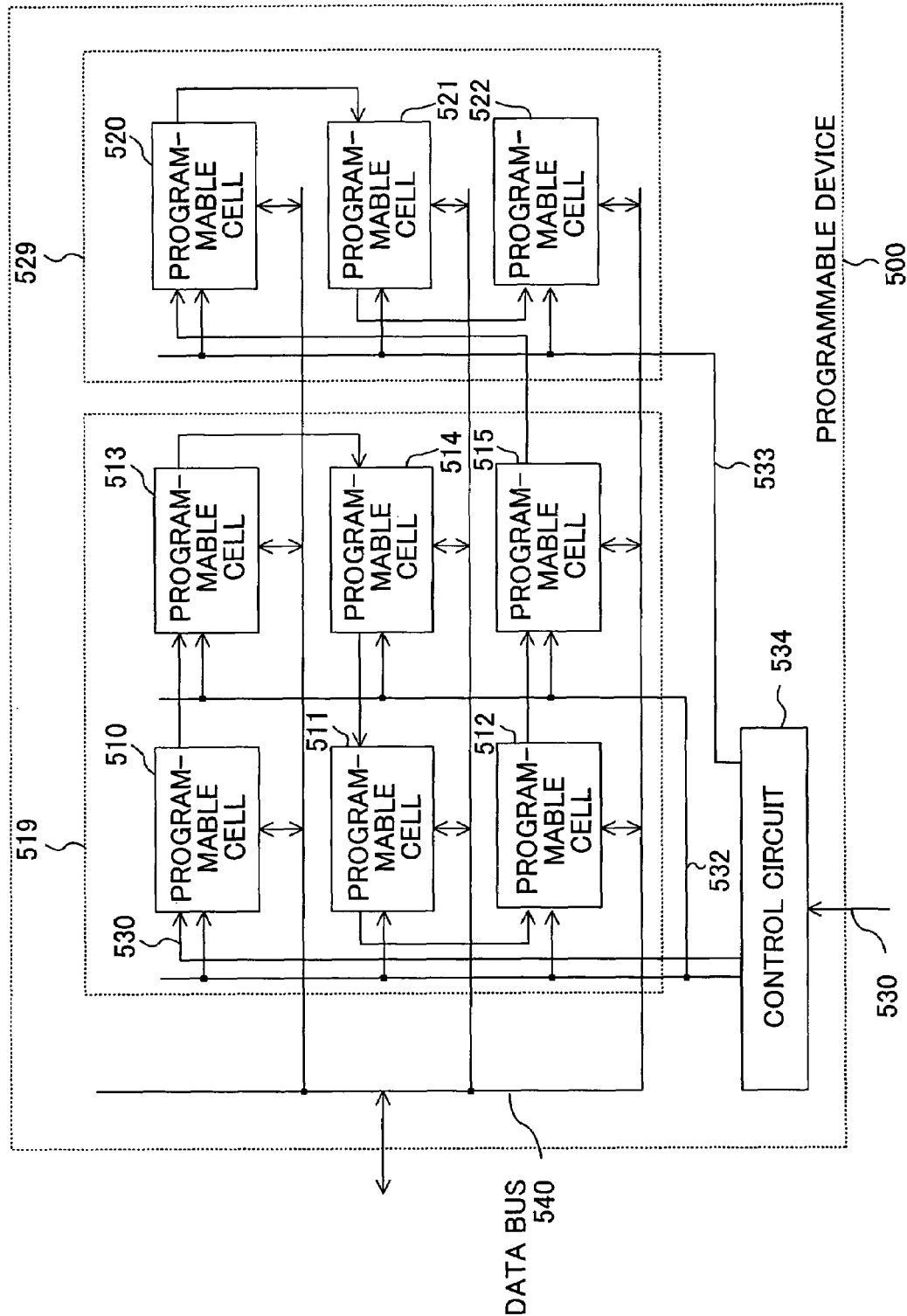
FIG. 5 is a block diagram illustrating the structure of a programmable device according to a second embodiment of the present invention.
Figure 6:
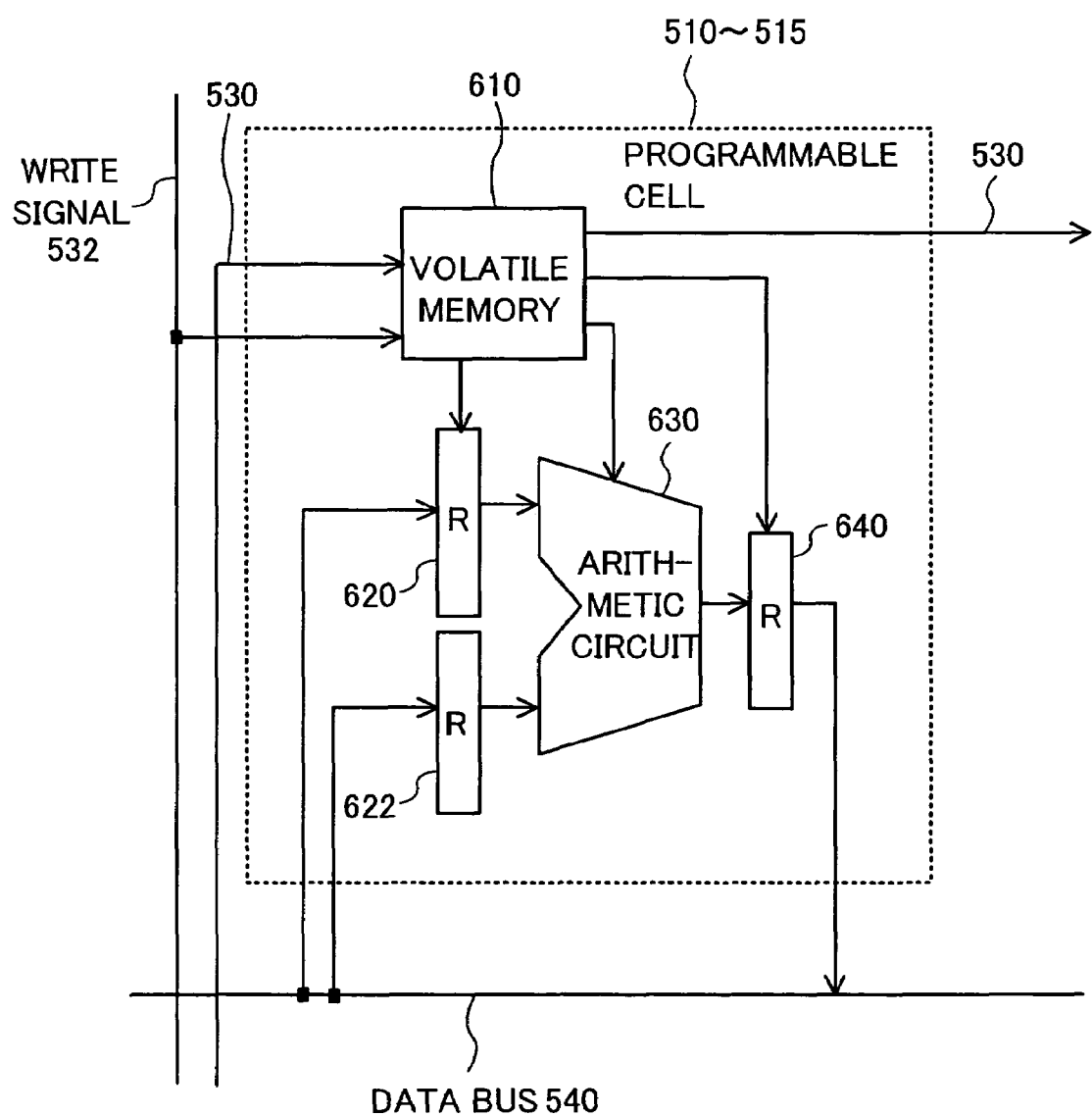
FIG. 6 is a block diagram illustrating the internal structures of first to sixth programmable cells shown in FIG. 5.
Figure 7:
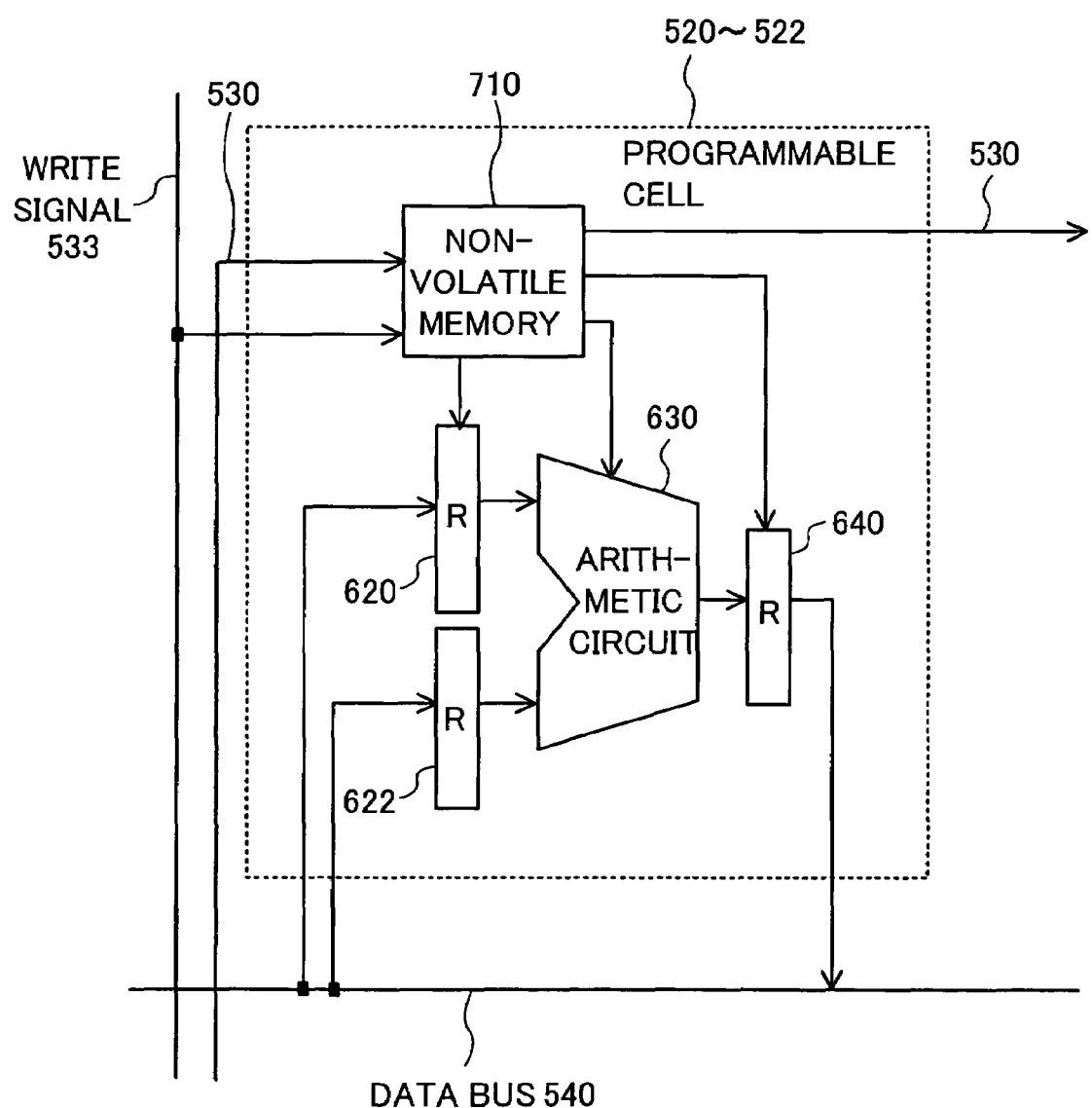
FIG. 7 is a block diagram illustrating the internal structures of seventh to ninth programmable cells shown in FIG. 5.

FIG. 5 illustrates the structure of a programmable device 500 according to a second embodiment. FIGS. 6 and 7 illustrate the internal structures of a plurality of programmable cells included in the programmable device 500.

The programmable device 500 shown in FIG. 5 includes a first region 519, a second region 529, a control circuit 534, and a data bus 540. The first region 519 includes first to sixth programmable cells 510 to 515 shown in FIG. 6. The second region 529 includes seventh to ninth programmable cells 520 to 522 shown in FIG. 7. The control circuit 534 receives configuration information 530 supplied from a block (not shown) and outputs a first write signal 532, a second write signal 533, and the configuration information 530. The first write signal 532 indicates that the configuration information 530 is to be stored in the first to sixth programmable cells 510 to 515. The second write signal 533 indicates that the configuration information 530 is to be stored in the seventh to ninth programmable cells 520 to 522. The data bus 540 provides the first to ninth programmable cells 510 to 515 and 520 to 522 with data on which operations are to be performed.

The first to sixth programmable cells 510 to 515 shown in FIG. 6 each include a volatile memory 610 for storing the configuration information 530 when the first write signal 532 is active. The seventh to ninth programmable cells 520 to 522 shown in FIG. 7 each include a non-volatile memory 710 for storing the configuration information 530 when the second write signal 533 is active. Operation for storing the configuration information 530 differs from that of the first embodiment in that the configuration information 530 is sequentially stored in the first to ninth programmable cells 510 to 515 and 520 to 522. More specifically, when the first write signal 532 is active, the configuration information 530 input into the first programmable cell 510 is stored in the volatile memory 610 included in the first programmable cell 510. The content retained in the volatile memory 610 is output to the fourth programmable cell 513 located to the right of the first programmable cell 510 as seen in FIG. 5. The fourth programmable cell 513 stores the input configuration information 530 (i.e., the output of the first programmable cell 510) in the volatile memory 610 included therein. Likewise, the configuration information 530 output from the fourth programmable cell 513 is held in the volatile memory 610 included in the fifth programmable cell 514. Then, as in a shift register, the configuration information 530 is sequentially written into the second, third, and sixth programmable cells 511, 512, and 515 in this order. Furthermore, when the second write signal 533 is also active, the configuration information 530 output from the sixth programmable cell 515 is retained in the non-volatile memory 710 included in the seventh programmable cell 520, and as in a shift register, the configuration information 530 is sequentially written into the eighth and ninth programmable cells 521 and 522 in this order in the same manner as described above.

The programmable device 500 carries out the process A shown in FIG. 4A or the process B shown in FIG. 4B in the following manner. First, the power for operating the programmable device 500 is turned on (the structure relating to the power-on procedure is not shown). Then, in the case of performing the process A, configuration information 530 supplied from a not-shown block is input into the control circuit 534. The control circuit 534 outputs the configuration information 530 and at the same time asserts the first and second write signals 532 and 533. As the configuration information 530 output from the control circuit 534, information for realizing the sub-process Y, which is included in common in the processes A and B, is output first, and then information for realizing the sub-process X and information for realizing the sub-process Z are output in sequence. In this process, the part of the configuration information for realizing the sub-process Y is stored in the seventh to ninth programmable cells 520 to 522 by way of the first, fourth and fifth programmable cells 510, 513 and 514 in this order. The part of the configuration information 530 for realizing the sub-process X is also input successively, and this information is stored in the second, third, and sixth programmable cells 511, 512, and 515 by way of the first, fourth and fifth programmable cells 510, 513 and 514. The part of the configuration information 530 for realizing the sub-process Z is also input successively, and this information is stored in the first, fourth, and fifth programmable cells 510, 513, and 514. That is, by the above operation, the part of the configuration information 530 that constitutes the sub-process X is written into the second, third, and sixth programmable cells 511, 512, and 515, the part of the configuration information 530 that constitutes the sub-process Y is written into the seventh to ninth programmable cells 520 to 522, and the part of the configuration information 530 that constitutes the sub-process Z is written into the first, fourth and fifth programmable cells 510, 513 and 514.

Next, data is input from outside through the data bus 540. The input data is subjected to the sub-process X executed by the second, third, and sixth programmable cells 511, 512, and 515, and the execution result is input into the seventh to ninth programmable cells 520 to 522 via the data bus 540. Then, the seventh to ninth programmable cells 520 to 522 execute the sub-process Y and input the execution result into the first, fourth and fifth programmable cells 510, 513 and 514 via the data bus 540. Subsequently, the first, fourth and fifth programmable cells 510, 513 and 514 execute the sub-process Z and output the execution result to outside through the data bus 540. After the process A is performed in this manner, the power to the programmable device 500 is turned off. At this time, since the programmable cells 520 to 522 store the configuration information in their non-volatile memories 710, the stored contents are not lost.

Next, in order for the programmable device 500 to perform the process B, the power for operating the programmable device 500 is turned on (the structure relating to the power-on procedure is not shown). Configuration information 530 supplied from a not-shown block is input into the control circuit 534 in the same manner as described above. The control circuit 534 outputs the configuration information 530 and at the same time asserts the first write signal 532, but does not assert the second write signal 533. As the configuration information output from the control circuit 534, information for realizing the sub-process V and then information for realizing the sub-process W are output in sequence, the sub-processes V and W being contained only in the process B. At this time, the part of the configuration information for realizing the sub-process V is stored in the second, third, and sixth programmable cells 511, 512, and 515 by way of the first, fourth and fifth programmable cells 510, 513 and 514 in this order. The part of the configuration information 530 for realizing the sub-process W is also input successively, and this information is stored in the first, fourth and fifth programmable cells 510, 513 and 514. That is, by the above-mentioned operation, the part of the configuration information 530 that constitutes the sub-process V is written into the second, third, and sixth programmable cells 511, 512, and 515, and the part of the configuration information 530 that constitutes the sub-process W is written into the first, fourth and fifth programmable cells 510, 513 and 514. The part of the configuration information that constitutes the sub-process Y remains stored in the seventh to ninth programmable cells 520 to 522.

As described above, when the process B is performed by the second configuration, the part of the configuration information for realizing the sub-process Y remains stored in the seventh to ninth programmable cells 520 to 522. Therefore, operation for newly storing that part of the configuration information 530 is not needed, whereby the same effects as those of the first embodiment are achieved. The second embodiment differs from the first embodiment in that the configuration information 530 is successively passed to the neighboring programmable cells, which enables the wiring for transmitting the configuration information 530 to be shortened to thereby reduce the circuit size further.

In the case described in this embodiment, configuration for realizing a process common to two types of processes, such as the sub-process Y, is performed in the seventh to ninth programmable cells 520 to 522. However, in cases in which a process, such as an OS (operating system), that is always involved in execution of various applications is assigned to the seventh to ninth programmable cells 520 to 522, similar effects are exhibited.

The threshold voltage of the transistors that constitute the volatile memories 610 may be set, taking the transistors' rewriting frequency into account, so that the transistors situated earlier in the sequential transmission of the configuration information 530 have lower threshold voltages. More specifically, of the first to sixth programmable cells 510 to 515 contained in the first region 519, the volatile memory 610 built into the first programmable cell 510 that receives the configuration information 530 output from the control circuit 534 is constituted by the transistor having the lowest threshold voltage, and then, the volatile memory 610 built into the fourth programmable cell 513 and the volatile memory 610 built into the fifth programmable cell 514 are constituted by transistors whose threshold voltages are sequentially higher. As described above, the configuration information 530 is sequentially transmitted in a chain-like manner from the first programmable cell 510 to the fourth programmable cell 513, and then from the fifth programmable cell 514 up to the sixth programmable cell 515. In cases in which configuration information to be rewritten is stored in part of the first region 519, the configuration information is rewritten into programmable cells located close to the first programmable cell 510 in the chain.

In these cases, programmable cells into which the configuration information is frequently rewritten are those located close to the first programmable cell 510, and the transistors constituting the volatile memories 610 included in those programmable cells have low threshold voltages. In other words, the threshold voltage of the transistors constituting the volatile memories 610 included in the programmable cells is increased, as the transistors' rewriting frequency decreases, thereby realizing a programmable device in which the amount of leakage current is small.

Third Embodiment

Figure 8:
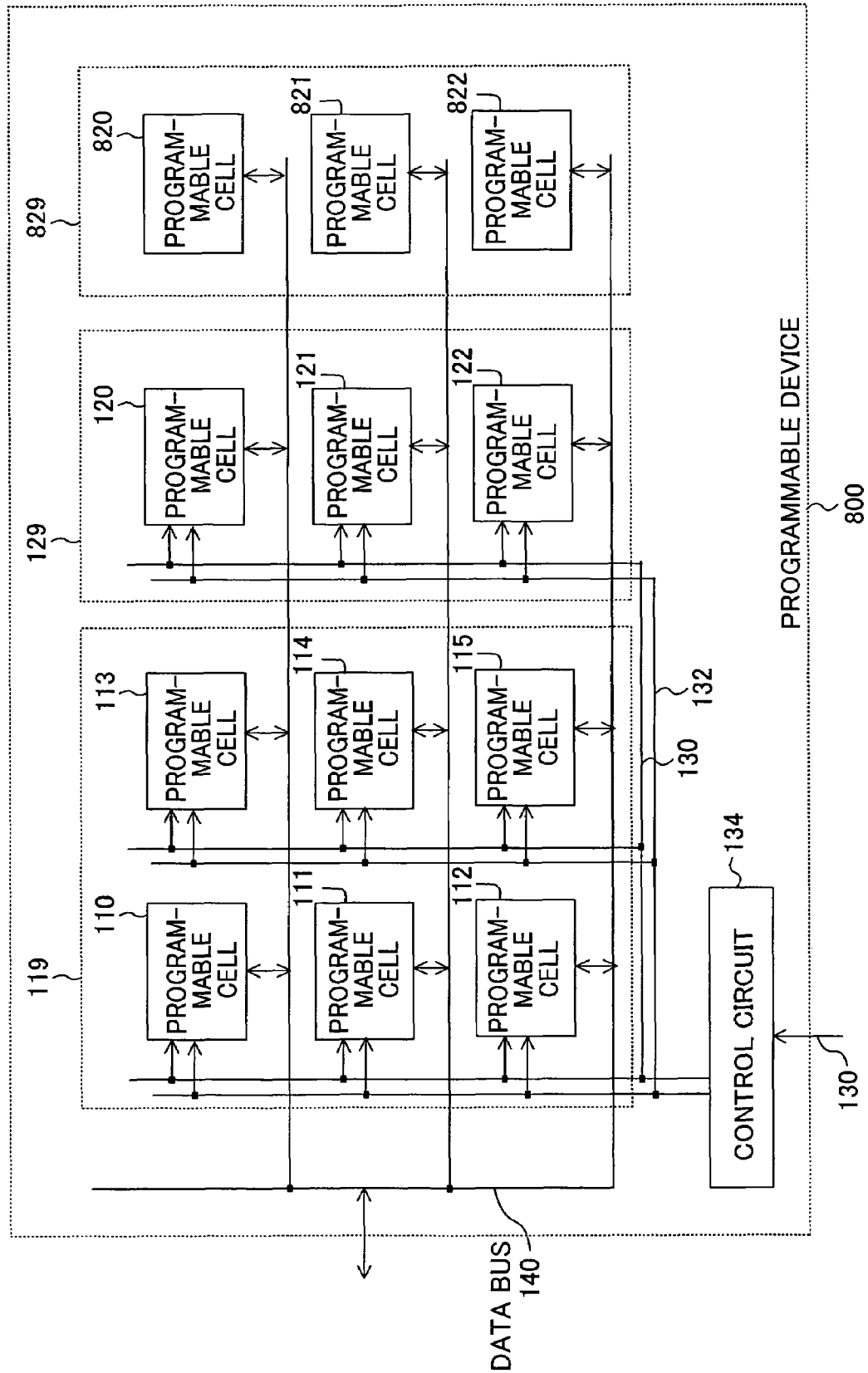
FIG. 8 is a block diagram illustrating the structure of a programmable device according to a third embodiment of the present invention.
Figure 9:
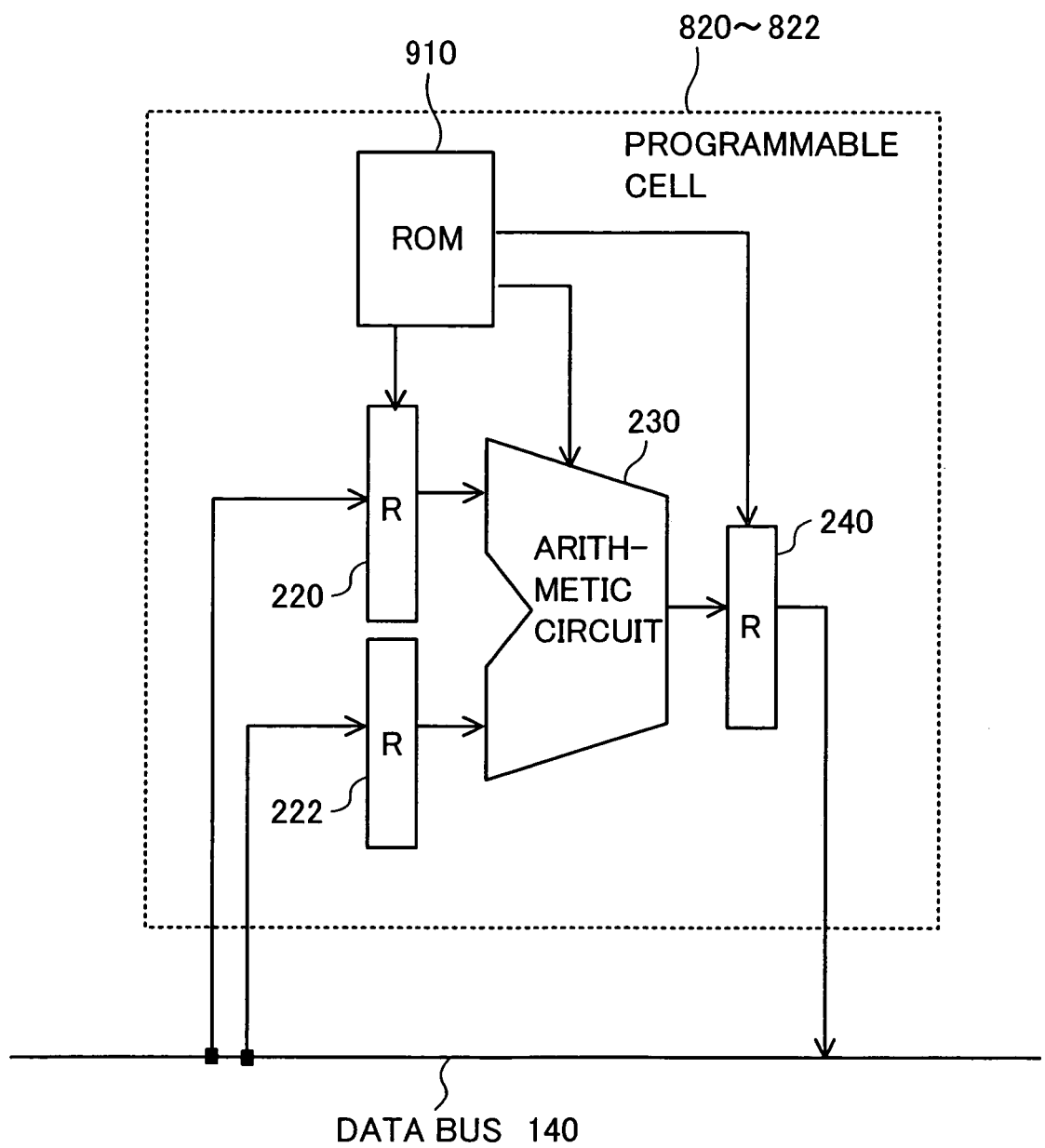
FIG. 9 is a block diagram illustrating the internal structures of tenth to twelfth programmable cells shown in FIG. 8.

FIG. 8 illustrates the structure of a programmable device 800 according to a third embodiment. FIG. 9 illustrates the internal structures of tenth to twelfth programmable cells 820 to 822 included in the programmable device 800.

The programmable device 800 shown in FIG. 8 differs from the programmable device 100 shown in FIG. 1 in that the programmable device 800 has, in addition to the above-described first and second regions 119 and 129, a third region 829 in which the tenth to twelfth programmable cells 820 to 822 are included, and that the tenth to twelfth programmable cells 820 to 822 shown in FIG. 9 have ROMs 910 in which information equivalent to the configuration information 130 is stored beforehand. Therefore, if process, whose operation contents do not require any changes after the shipment of the LSI having the programmable device 800 mounted thereon, is stored beforehand in the respective ROMs 910 included in the tenth to twelfth programmable cells 820 to 822, writing of configuration information 130 is not necessary. This enables the amount of time required for the configuration to be reduced. In addition, as in the first embodiment, every time process is complete, the power can be frequently turned off to reduce the amount of electric power consumed by the programmable device 800.

It should be noted that the tenth to twelfth programmable cells 820 to 822 having the ROMs 910 may be added to the programmable device 500 shown in FIG. 5.

The first to third embodiments have been described so far, and lastly, a specific cell-packaging method will be discussed.

Figure 10:
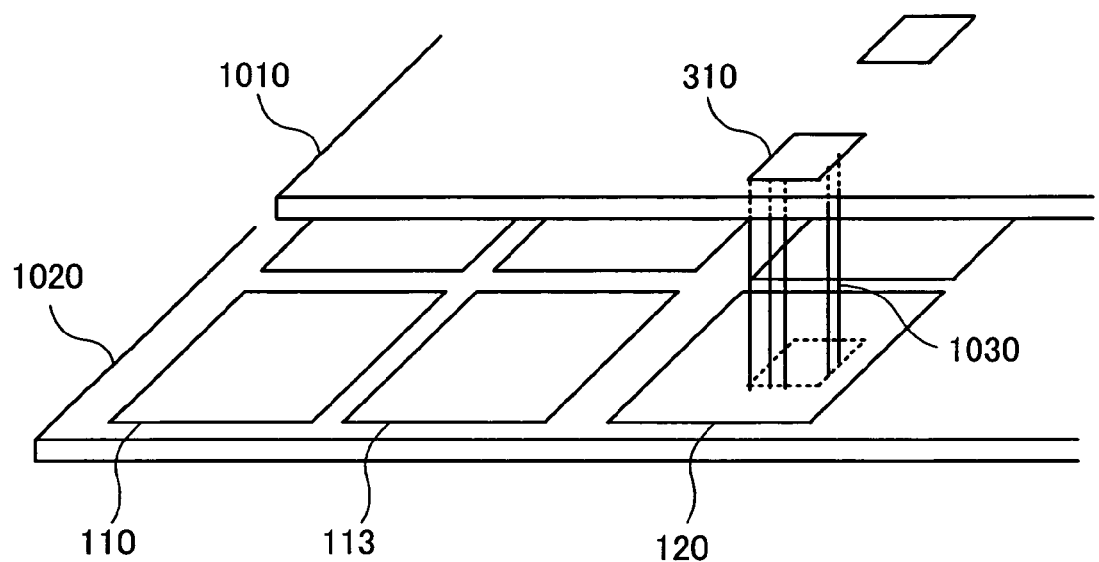
FIG. 10 is a perspective view of semiconductor chips, illustrating an exemplary mounting in the programmable device of FIG. 1.

FIG. 10 is a view illustrating a structure into which the first, fourth, and seventh programmable cells 110, 113, and 120, etc., used in the first embodiment are integrated. On a first semiconductor chip 1010, the non-volatile memory 310 built into the seventh programmable cell 120 is integrated. On a second semiconductor chip 1020, in addition to the components included in the seventh programmable cell 120 except for the non-volatile memory 310, the first and fourth programmable cells 110 and 113, the control circuit 134, wiring for the configuration information 130, wiring for the control signal 132, and the like are integrated.

The structure of the seventh programmable cell 120 will be described below. On the second semiconductor chip 1020, all of the programmable cells are first integrated as the structures shown in FIG. 2, i.e., the structures including the volatile memories 210. In order to obtain the structure of the seventh programmable cell 120, that is, the programmable cell structure in which the non-volatile memory 310 is mounted, the non-volatile memory 310 integrated on the first semiconductor chip 1010 is electrically connected with one of the volatile memories 210 integrated on the second semiconductor chip 1020 by wiring 1030 so that the volatile memory 210 is not used. By doing this, one of the programmable cells originally including the volatile memories 210 is changed into a programmable cell including the non-volatile memory 310, thereby obtaining the seventh programmable cell 120.

Non-volatile memories, typified by FeRAMs, typically require special circuits, e.g., a plurality of power wires and process dimensions. The above-described structure allows the non-volatile memory 310 to be integrated on the first semiconductor chip 1010 being in suitable process conditions, whereby the circuit size of the entire programmable device is reduced further.

It should be noted that the non-volatile memories 310 and 710 in the second and third embodiments may be constructed in the same manner as shown in FIG. 10.

In the foregoing embodiments, the number of programmable cells included in the programmable device is nine or twelve, but any number of programmable cells may be included. Also, in the foregoing embodiments, the number of programmable cells included in the first region 119 (519), the second region 129 (529) and the third region 829 is six, three, and three, respectively, but any number of programmable cells may be included in those regions. Although the first to sixth programmable cells 110 to 115 (510 to 515) and the seventh to ninth programmable cells 120 to 122 (520 to 522) have substantially the same structure except for the internal memories, the individual programmable cells may have different structures, because it is sufficient if the programmable device includes a region in which configuration information is stored in the volatile memories 210 (610) and a region in which the configuration information is stored in the non-volatile memories 310 (710) as described above.

As described above, the programmable devices of the present invention produce the effect of reducing the configuration time after power-off, the circuit size, and hence power consumption, and thus effectively function as FPGA and the like.

What is claimed is:

1. A programmable device comprising:
   a plurality of programmable cells comprising a first-type programmable cell and a second-type programmable cell, each of the plurality of programmable cells including an internal memory for storing configuration information input from outside and an arithmetic circuit for performing operation based on the configuration information stored in the internal memory; and
   a control circuit for outputting, to the first-type programmable cell and the second-type programmable cell, the configuration information and a control signal indicating in which programmable cell the configuration information is to be stored,
   wherein the first-type programmable cell includes a non-volatile memory as the internal memory; and
   the second-type programmable cell includes a volatile memory as the internal memory.

2. The programmable device of claim 1, wherein when the programmable device performs either a first or second process, both of the first and second processes including a common sub-process, the common sub-process is performed in the first-type programmable cell.

3. The programmable device of claim 1, wherein the plurality of programmable cells further comprises a third type of programmable cell which includes a read-only memory (ROM) having configuration information stored therein in advance and an arithmetic circuit for performing operation based on the configuration information stored in the ROM.

4. The programmable device of claim 1, further comprising:
   a first semiconductor chip, on which, of the components of the first-type programmable cell, the non-volatile memory is mounted; and
   a second semiconductor chip, on which the components other than the non-volatile memory are mounted,
   wherein the first semiconductor chip is electrically connected with the second semiconductor chip.

5. A programmable device comprising:
   a plurality of programmable cells comprising a first-type programmable cell and a second-type programmable cell, each of the plurality of programmable cells including an internal memory for storing configuration information input from outside and an arithmetic circuit for performing operation based on the configuration information stored in the internal memory; and
   a control circuit for outputting, to the second-type programmable cell, the configuration information and a first control signal indicating writing of the configuration information, the control circuit further outputting, to the first-type programmable cell, a second control signal,
   wherein the first-type programmable cell includes a non-volatile memory as the internal memory;
   the second-type programmable cell includes a volatile memory as the internal memory;
   the first-type programmable cell is configured to receive the configuration information from the second-type programmable cell, and the second control signal instructs that the configuration information received from the second-type programmable cell by the first-type programmable cell be written into the first-type programmable cell; and
   the control circuit asserts the first control signal and the second control signal individually.

6. The programmable device of claim 5, wherein the plurality of programmable cells comprises a plurality of the second-type programmable cells, and
   wherein sequential transmission of the configuration information is performed among the plurality of the second-type programmable cells.

7. The programmable device of claim 6, wherein threshold voltage of transistors forming the volatile memories in the second-type programmable cells is set so that transistors situated earlier in the sequential transmission of the configuration information have lower threshold voltages.

8. The programmable device of claim 5, wherein when the programmable device performs either a first or second process having a common sub-process, the common sub-process is performed in the first-type programmable cell.

9. The programmable device of claim 5, wherein the plurality of programmable cells further comprises a third type of programmable cell which includes a read-only memory (ROM) having configuration information stored therein in advance and an arithmetic circuit for performing operation based on the configuration information stored in the ROM.

10. The programmable device of claim 5, further comprising:
    a first semiconductor chip, on which, of the components of the first-type programmable cell, the non-volatile memory is mounted; and
    a second semiconductor chip, on which the components other than the non-volatile memory are mounted,
    wherein the first semiconductor chip is electrically connected with the second semiconductor chip.

11. A programmable device comprising:
    a plurality of programmable cells comprising a first-type programmable call and a second-type programmable cell, each of the plurality of programmable cells including an internal memory for storing configuration information input from the outside and an arithmetic circuit for performing operation based on the configuration information stored in the internal memory; and
    a control circuit for outputting, to the first-type programmable cell and the second-type programmable cell, the configuration information and a control signal indicating writing of the configuration information,
    wherein the first-type programmable cell includes a non-volatile memory as the internal memory;
    the second-type programmable cell includes a volatile memory as the internal memory; and
    when the programmable device performs either a first or second process, both of the first and second processes including a common sub-process, the common sub-process is performed entirely in the first-type programmable cell.

12. The programmable device of claim 11, wherein the plurality of programmable cells further comprises a third type of programmable cell which includes a read-only memory (ROM) having configuration information stored therein in advance and an arithmetic circuit for performing operation based on the configuration information stored in the ROM.

13. The programmable device of claim 11, further comprising:
a first semiconductor chip, on which, of the components of the first-type programmable cell, the non-volatile memory is mounted; and
a second semiconductor chip, on which the components other than the non-volatile memory are mounted,
wherein the first semiconductor chip is electrically connected with the second semiconductor chip.

14. A programmable device comprising:
a plurality of programmable cells comprising a first-type programmable cell and a second-type programmable cell, each of the plurality of programmable cells including an internal memory for storing configuration information input from outside and an arithmetic circuit for performing operation based on the configuration information stored in the internal memory; and
a control circuit for outputting, to the second-type programmable cell, the configuration information and a first control signal indicating writing of the configuration information, the control circuit further outputting, to the first-type programmable cell, a second control signal,
wherein the first-type programmable cell includes a non-volatile memory as the internal memory,
the second-type programmable cell includes a volatile memory as the internal memory,
the first-type programmable cell is configured to receive the configuration information from the second-type programmable cell, and the second control signal instructs that the configuration information received from the second-type programmable cell by the first-type programmable cell be written into the first-type programmable cell, and
when the programmable device performs either a first or second process, both of the first and second processes including a common sub-process, the common sub-process is performed entirely in the first-type programmable cell.

15. The programmable device of claim 14, wherein the plurality of programmable cells comprise a plurality of the second-type programmable cells, and sequential transmission of the configuration information is performed among the plurality of the second-type programmable cells.

16. The programmable device of claim 15, wherein the threshold voltage of transistors forming the volatile memories in the second-type programmable cells is set so that transistors situated earlier in the sequential transmission of the configuration information have lower threshold voltages.

17. The programmable device of claim 14, wherein the plurality of programmable cells further comprise a third type of programmable cell which includes a read-only memory (ROM) having configuration information stored therein in advance and an arithmetic circuit for performing operation based on the configuration information stored in the ROM.

18. The programmable device of claim 14, further comprising:
a first semiconductor chip, on which, of the components of the first-type programmable cell, the non-volatile memory is mounted; and
a second semiconductor chip, on which the components other than the non-volatile memory are mounted,
wherein the first semiconductor chip is electrically connected with the second semiconductor chip.

19. A programmable device comprising:
a plurality of programmable cells comprising a first-type programmable cell and a plurality of second-type programmable cells, each of the plurality of programmable cells including an internal memory for storing configuration information input from outside and an arithmetic circuit for performing operations based on the configuration information stored in the internal memory; and
a control circuit for outputting, to the second-type programmable cell, the configuration information and a first control signal indicating writing of the configuration information, the control circuit further outputting, to the first-type programmable call, a second control signal,
wherein the first-type programmable cell includes a non-volatile memory as the internal memory,
each of the plurality of second-type programmable cells includes a volatile memory as the internal memory,
the first-type programmable cell is configured to receive the configuration information from one of the plurality of second-type programmable cells, and the second control signal instructs that the configuration information received from one of the plurality of second-type programmable cells by the first-type programmable cell be written into the first-type programmable cell,
sequential transmission of the configuration information is performed among the plurality of second-type programmable cells, and
threshold voltages of transistors forming the volatile memories in the second-type programmable cells is set so that transistors situated earlier in the sequential transmission of the configuration information have lower threshold voltages.

* * * * *